US010763205B2

(12) United States Patent
Pawaskar et al.

(10) Patent No.: US 10,763,205 B2
(45) Date of Patent: Sep. 1, 2020

(54) INPUT/OUTPUT CELL WIRE CONNECTOR

(71) Applicant: Seagate Technology LLC, Cupertino, CA (US)

(72) Inventors: Pritesh Pawaskar, Maharashtra (IN); Yehuda Smooha, Allentown, PA (US); Shrikrishna Nana Mehetre, Maharashtra (IN)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 614 days.

(21) Appl. No.: 15/649,337

(22) Filed: Jul. 13, 2017

(65) Prior Publication Data

US 2019/0019747 A1 Jan. 17, 2019

(51) Int. Cl.
| H01L 23/50 | (2006.01) |
| H01L 23/498 | (2006.01) |
| H01L 27/02 | (2006.01) |
| H01L 23/00 | (2006.01) |

(52) U.S. Cl.
CPC ........ *H01L 23/50* (2013.01); *H01L 23/49811* (2013.01); *H01L 23/49827* (2013.01); *H01L 24/81* (2013.01); *H01L 27/0292* (2013.01); *H01L 27/0296* (2013.01); *H01L 2224/80122* (2013.01); *H01L 2224/81122* (2013.01)

(58) Field of Classification Search
USPC .................................................. 361/56, 111
See application file for complete search history.

(56) References Cited

U.S. PATENT DOCUMENTS

| 5,051,860 | A | | 9/1991 | Lee et al. |
| 5,157,573 | A | | 10/1992 | Lee et al. |
| 5,270,565 | A | | 12/1993 | Lee et al. |
| 5,535,084 | A | * | 7/1996 | Nakayama ......... H01L 27/0248 257/356 |
| 6,258,672 | B1 | | 7/2001 | Shih et al. |
| 9,545,041 | B2 | | 1/2017 | Lai et al. |
| 9,577,640 | B1 | * | 2/2017 | Park ................... H03K 19/1736 |
| 2004/0052020 | A1 | | 3/2004 | Ker et al. |
| 2007/0097581 | A1 | * | 5/2007 | Khazhinsky ........... H02H 9/046 361/111 |
| 2014/0211357 | A1 | * | 7/2014 | Matsuoka ........... H01L 23/5223 361/111 |
| 2015/0378887 | A1 | * | 12/2015 | Lee ..................... G06F 12/0246 711/103 |

* cited by examiner

*Primary Examiner* — Danny Nguyen
(74) *Attorney, Agent, or Firm* — Westman, Champlin & Koehler, P.A.

(57) ABSTRACT

An input/output (I/O) circuit includes at least one I/O cell having a first size, and a high current circuit coupled to the at least one I/O cell. The high current circuit has a second size that is smaller than the first size. A connection bus is coupled to the high current circuit. The connection bus has the second size and is positioned in substantially a same location within the I/O circuit as the high current circuit. A bump or a bond pad is coupled to the connection bus.

13 Claims, 4 Drawing Sheets

INPUT/OUTPUT CELL WIRE CONNECTOR

SUMMARY

In one embodiment, an input/output (I/O) circuit includes at least one I/O cell having a first size, and a high current circuit coupled to the at least one I/O cell. The high current circuit has a second size that is smaller than the first size. A connection bus is coupled to the high current circuit. The connection bus has the second size and is positioned in substantially a same location within the I/O circuit as the high current circuit. A bump or bond pad is coupled to the connection bus.

In another embodiment, an input/output circuit includes at least one power bus having a first size, at least one ground bus having the first size, and an electrostatic discharge (ESD) protection circuit coupled to the at least one power bus or the at least one ground bus. The ESD protection circuit has a second size that is substantially smaller than the first size. A connection bus coupled to the ESD protection circuit, the connection bus having the second size and positioned in substantially a same location within the input/output circuit as the ESD protection circuit. A bump or bond pad is coupled to the connection bus.

In another embodiment, a method of manufacturing an input/output circuit includes identifying a connecting area of high current density in an input/output cell, and sizing a connecting bus to a size approximately equal to that of the connecting area of high current density. A connecting bus is positioned in the connecting area of high current density. High current lines are connected to a high current device at the connecting bus.

This summary is not intended to describe each disclosed embodiment or every implementation of the I/O cell connectors described herein. Many other novel advantages, features, and relationships will become apparent as this description proceeds. The figures and the description that follow more particularly exemplify illustrative embodiments.

DETAILED DESCRIPTION OF ILLUSTRATIVE EMBODIMENTS

Figure 2:
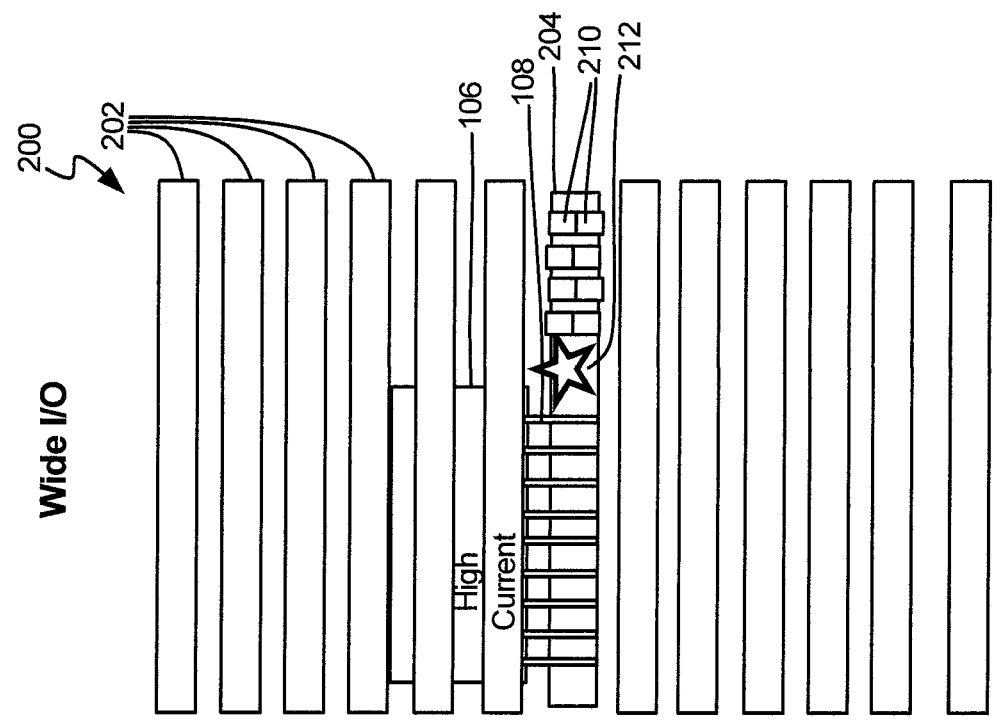
FIG. 2 is a diagram of an I/O cell of a second larger size.

Embodiments described below relate to input/output (I/O) cells, and more specifically to I/O cells using high current circuitry.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Figure 1:
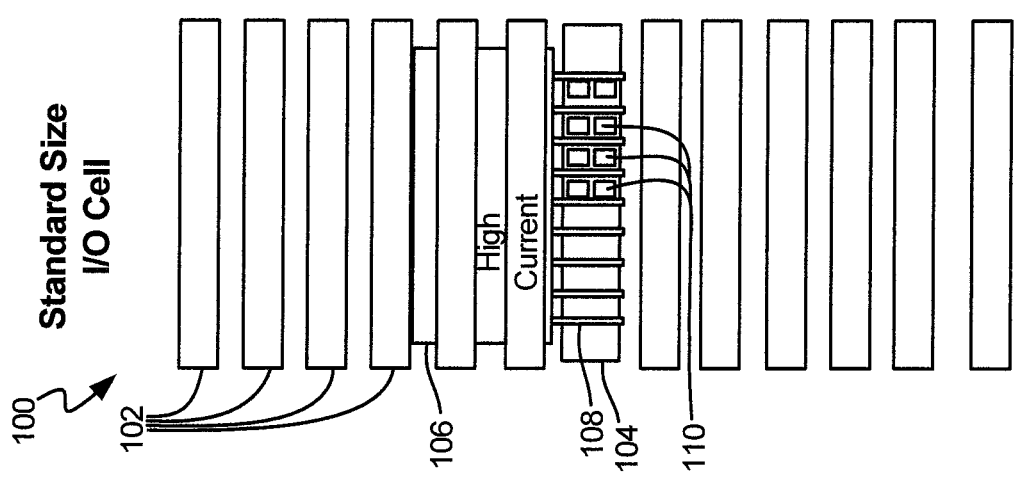
FIG. 1 is a diagram of an I/O cell of a first size.

FIGS. 1 and 2 show a standard size I/O cell 100 (FIG. 1) and a wide I/O cell 200 (FIG. 2). A wide I/O cell is in one embodiment an I/O cell having a width greater than about 60 micrometers (μm). However, wide may be a relative term in which a wide I/O cell is an I/O cell that is a certain amount, such as a percentage, greater in width than another I/O cell in the same device or configuration.

In FIG. 1, for a standard size I/O cell 100, a number of power and ground lines 102 are shown. Power and ground lines are buses that support I/O cell circuitry. A bump or bond-wire connecting bus (BBCB) 104 is shown for connection of circuitry such as high current circuitry 106 from other levels of a die or the like to the I/O cells, via the BBCB 104. High current circuitry 106 connects via lower level metal lines 108 to the BBCB 104. Through vias 110 in the BBCB 104 extend from lower levels to upper levels, and provide locations for higher level metal connections to a bump or bond-wire, such as on an integrated circuit package, or the like. In FIG. 1, the width of the BBCB 104 is close to the width of the standard size I/O cells (represented by the power and ground metal lines 102). As about half of the lines 108 connecting high current circuitry 106 to the BBCB 104 are in the vicinity of the vias 110, about half of the current of the high current circuitry 106 passes vertically through the vias, and about half of the current of the high current circuitry 106 passes laterally through the BBCB 104.

In FIG. 2, for a wide I/O cell 200, a number of power and ground lines 202 are shown. Power and ground lines are buses that support I/O cell circuitry. A bump or bond-wire connecting bus (BBCB) 204 is shown for connection of circuitry such as high current circuitry 106 from other levels of a die or the like to the I/O cells, via the BBCB 204. This BBCB 204 is substantially the same width as the wide I/O cells 202. High current circuitry 106 connects via lower level metal lines 108 to the BBCB 204. Through vias 210 in the BBCB 204 extend from lower levels to upper levels, and provide locations for higher level metal connections to a bump or bond-wire, such as on an integrated circuit package, or the like. In FIG. 2, the width of the BBCB 204 is also close to the width of the wide I/O cells (represented by the power and ground metal lines 202).

However, in such a configuration, connection to high current circuitry 106 using lower level metal lines 108 to the BBCB 204 may not be in the area of the through vias 210 of BBCB 204. Therefore, in such a configuration, all or substantially all of the lines 108 connecting high current circuitry 106 to the BBCB 204 are displaced laterally from the through vias 210, and therefore, all of the current of the high current circuitry 106 passes laterally through the BBCB 204. In many instances, current crowding occurs when multiple high current lines attempt to pass through the BBCB 204 laterally at point 212, since no through vias 210 are in the vicinity of the wire 108 connections to the BBCB 204. This can create a bottleneck that can cause failure of the BBCB 204 at point 212. As one high current circuit element is electrostatic discharge (ESD) protection, a failure in that can destroy an entire device for any number of reasons, including by way of example only and not by way of limitation, insufficient via cuts or clamps between an I/O pad and I/O buffers, memory, interconnect meltdown from heat due to current crowding, insufficient wire width on ESD pathways, and the like.

While manual decisions about placement of the vias 210 with respect to the lower level metal lines 108 may be done, as the number of I/O cells and connections in modern circuits continue to increase, such manual placement is becoming very time intensive, as well as difficult. Further, it is difficult to inspect each pin connection. Electronic design automation tools may be used to detect errors of this type, but such tools are typically used very late in the process of fabrication, and correction of errors may be difficult or impossible at that late stage of fabrication.

Protection devices such as ESD devices within an I/O circuit, especially using wide I/O cells, may not be visible or easily connected to a proper position within an I/O cell using standard connection techniques, as has been shown above. Embodiments of the present disclosure identify a protection device inside I/O circuitry, and the connection buses for that I/O circuitry. Using this information, I/O connections with bump or bond-wire connecting buses are made using a BBCB sized and positioned to accommodate high current circuitry such as ESD devices or any other high current circuitry. In some embodiments, a portion of the wire of an I/O pin, instead of an entire wire, is made accessible by a physical implementation tool. This location and sizing of the BBCB prevents I/O connection away from the high current circuitry, such as ESD protection devices, and increases reliability. Embodiments of the present disclosure therefore customize the size of an I/O pin depending on the location of an ESD protection diode or any other high current circuit.

Figure 3:
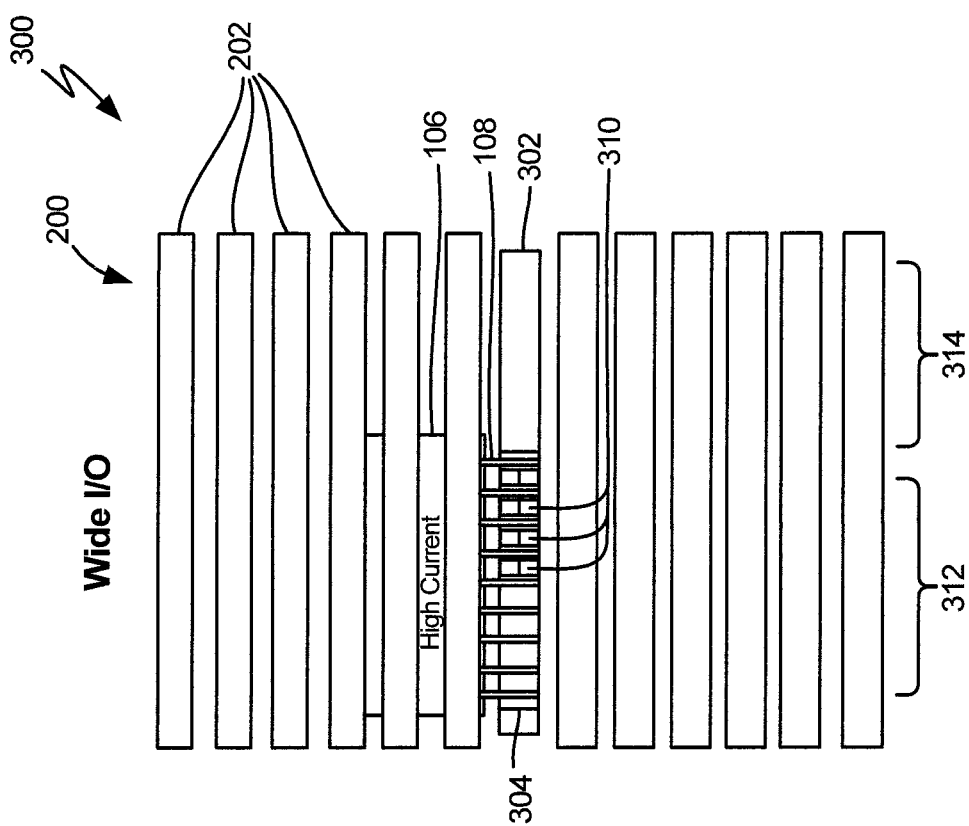
FIG. 3 is a diagram of an I/O cell according to an embodiment of the present disclosure.

FIG. 3 illustrates an embodiment 300 of the present disclosure for connecting a wide I/O cell 200 to high current circuitry 106 using a modified BBCB 304. In the embodiment 300, BBCB 304 is sized according to the size of high current circuitry 106. In the embodiment 300 of FIG. 3, BBCB 304 is substantially the same size as the connecting area to high current circuitry 106. Substantially the same size in this embodiment is smaller than the wide I/O cells 200, which are also wider than the high current circuitry 106 connection area to the BBCB 304. Further, since wide I/O cell 200 is wider than the high current circuitry 106, the placement of the narrower BBCB 304 with respect to the high current circuitry is also controlled. The portion 312 of the I/O cell 200 containing the lower level metal lines 108 that connect to high current circuitry 106 is used as the location for the BBCB 304. That is, the BBCB 304 is positioned in substantially a same location as the connection to the high current circuitry. Through vias 310 in the BBCB 304 extend from lower levels to upper levels, and provide locations for higher level metal connections to a bump or bond-wire, such as on an integrated circuit package, or the like. In FIG. 3, the width of the BBCB 304 is close to the width of the BBCB 104 used for the standard size I/O cells (shown in FIG. 1), but is used for the wide I/O cell 200. As about half of the lines 108 connecting high current circuitry 106 to the BBCB 304 are in the vicinity of the vias 310, about half of the current of the high current circuitry 106 passes vertically through the vias 310, and about half of the current of the high current circuitry 106 passes laterally through the BBCB 304. This reduces the potential for current crowding by providing a BBCB 304 that is appropriately sized and positioned to accommodate high current from a high current circuit such as circuitry 106.

In the embodiment shown in FIG. 3, the BBCB 304 is sized and positioned according to the size and position of the high current circuitry that will be connected using it. In one embodiment, that portion 314 of the I/O cell 302 that is not collocated with the BBCB 304 is used for power/ground buses. In another embodiment, that portion 314 of the I/O cell 302 that is not collocated with the BBCB 304 is used is blocked, such as with a gap or other current blocking structure, to avoid recreating a current crowding issue such as is shown in FIG. 2. The blockage could also be done by coding a layer on top of the actual metal layer to render the BBCB 304 invisible to a place and route software tool.

Determination of the placement and size of BBCB 304 is made in one embodiment based on circuit layout, which will be known at the design phase. Accordingly, a BBCB 304 having a smaller size results in shorter connections to the bump or bond pad/bond-wire of the circuitry 106. Instead of having high current travelling laterally through the BBCB to through vias that are potentially separated from the bump or bond-wire, which can cause current crowding especially with multiple high current paths through a small area over a long lateral run, the current travels laterally a similar distance to that of regular sized I/O cells, since the high current area size and location is known. The connection bus 304 is positioned within the I/O cell 302 to reduce lateral high current travel area and distance, therefore reducing current crowding and its associated issues.

In the embodiment 300 shown in FIG. 3, the width of the I/O cell 302 is narrower for that cell with the BBCB 304. As the lines 102 are in most configurations power and ground busses, when stacked, such lines will make connections by butting up next to an adjacent line. However, for an I/O pad, such a connection is not made. The sizing of the BBCB 304 is therefore slightly smaller in width than the remainder of the wide I/O cells.

Placement of the connecting bus for large I/O cells, traditionally the full size of the I/O cell, is reduced to be near to the size of the high current circuitry location. This may be determined based on circuit layout, and will be known at design. Accordingly, the connecting bus smaller size results in shorter connections to the bump or bond-wire of the circuitry. Instead of having high current travelling laterally through the connecting bus to vias that are potentially separated from the bump or bond-wire, which can cause current crowding especially with multiple high current paths through a small area over a long lateral run, the current travels laterally a similar distance to that of regular sized I/O cells, since the high current area is known. Accordingly, the connection bus is placed within the I/O cell to reduce lateral high current travel area and distance, therefore reducing current crowding and its associated issues.

Figure 4:
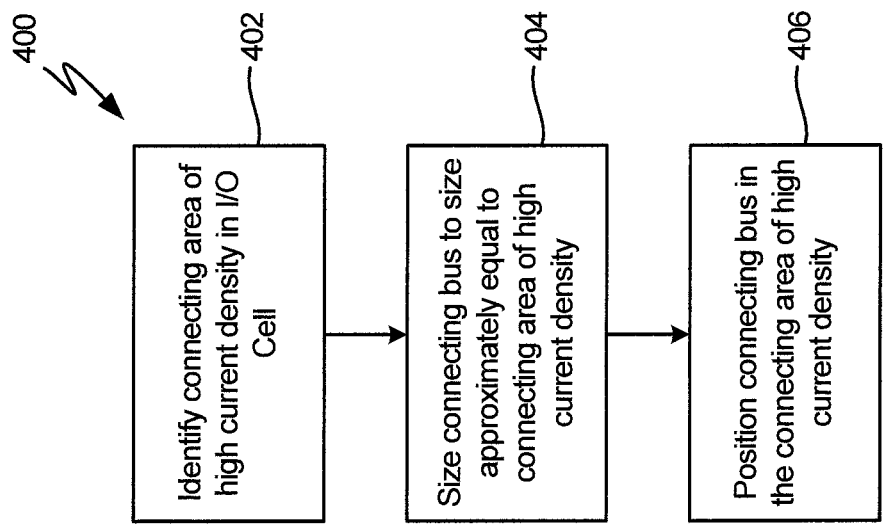
FIG. 4 is a flow chart diagram of a method according to an embodiment of the present disclosure.

An embodiment of a method 400 for placing a bump or bond-wire connecting bus (BBCB) is shown in flow chart form in FIG. 4. Method 400 comprises, in one embodiment, identifying a connecting area of high current density in an input/output cell in block 402, sizing a connecting bus to a size approximately equal to that of the connecting area of high current density in block 404, positioning the connecting bus in the connecting area of high current density in block 406, and connecting high current lines (e.g., lower level high current lines) to a high current device at the connecting bus in block 406.

Connection of high current lines in one embodiment comprises creating through vias in a high current area of the BBCB near high current circuitry, and connecting at least a portion of the high current lines using the vias. In another embodiment, the method further comprises blocking a portion of I/O cell not used for the BBCB. In another embodiment, the method further comprises using a portion for the I/O cell not used for the BBCB for power and/or ground buses. In one embodiment, a width of an I/O cell used with a BBCB is narrowed to a width less than surrounding I/O cells.

Embodiments of the present disclosure are amenable for use in any device having or using I/O bump or bond-wire connections, including by way of example only and not by way of limitation, in interfaces between memory controllers and memory, such as DDR controllers, and in general in high speed interfaces. Embodiments of the present disclosure may be used with drives of different types, including hard disk drives, solid state drives, and the like.

In one embodiment, the high current circuitry 106 is ESD circuitry. ESD circuitry often has a high current output, and ESD protection encounters what can be high amounts of lateral current crowding. ESD protection often includes diode protection such as a p+ to n-well diode to a power bus, and an n+ to p-well diode to ground bus. This dual diode ESD protection circuitry may be the highest current consuming area in an I/O cell. While ESD protection is discussed more herein, it should be understood that any high current I/O circuitry, including by way of example only and not by way of limitation circuitry that may consume large amounts of current, LED drivers for example, are amenable for use with the embodiments of the present disclosure.

Figure 5:
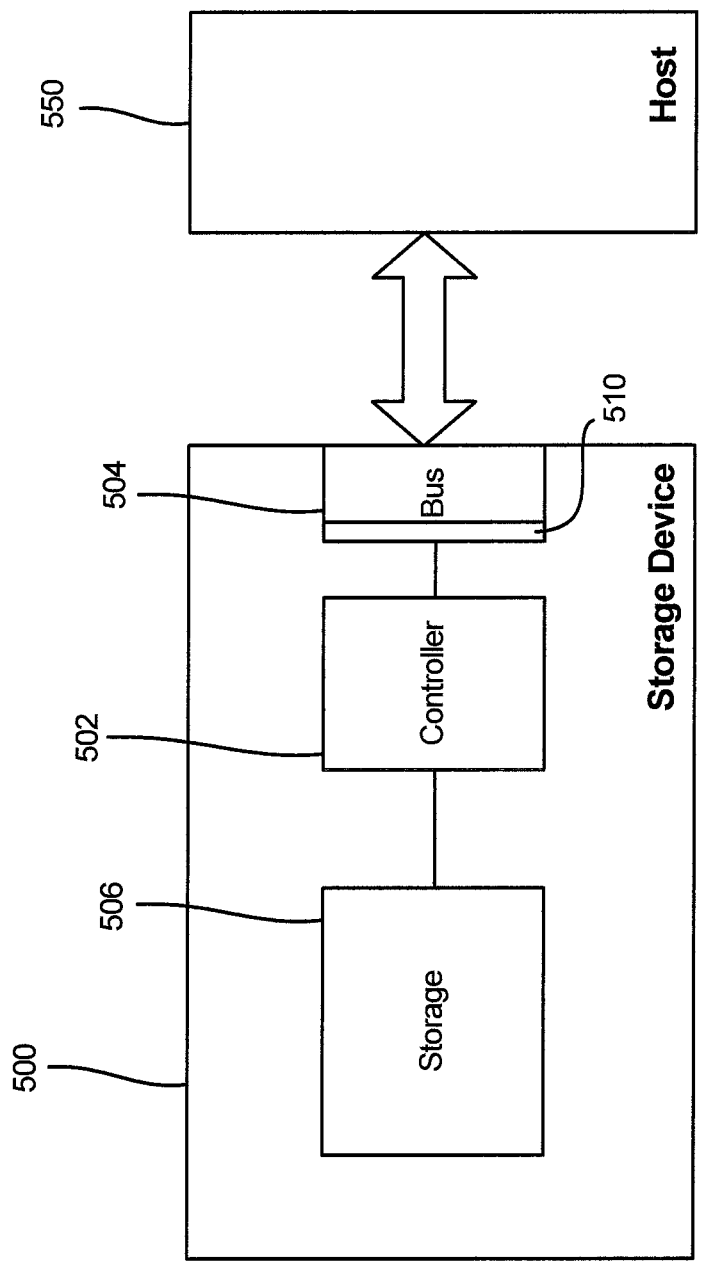
FIG. 5 is a block diagram of a data storage device on which embodiments of the present disclosure may be used.

Referring now to FIG. 5, a simplified block diagram of a storage system 500 in accordance with an embodiment of the present disclosure is shown. Storage system 500 may be any storage system, such as is in one embodiment a hard disc drive (HDD) including by way of example rotatable discs; write heads; and associated controllers such as are known in the art; or in another embodiment a solid state drive including non-volatile memory and associated controllers such as are known in the art; or any other storage system for persistent storage of information. System 500 may include, by way of example, a controller 502 coupleable via a bus 504 or the like to a host system 550, where the host system 550 may provide power over the bus 504 or through a separate power bus (not shown), and a storage component 506 (such as rotatable platters or nonvolatile memory). An I/O cell layout and BBCB 510 (such as those described above with respect to FIGS. 3-4) may be provided with bus 504, between the host 550 and storage device 500, or as a part of the storage device 500, such as on an integrated circuit, ASIC, or the like, or on I/O pads of the same.

Figure 6:
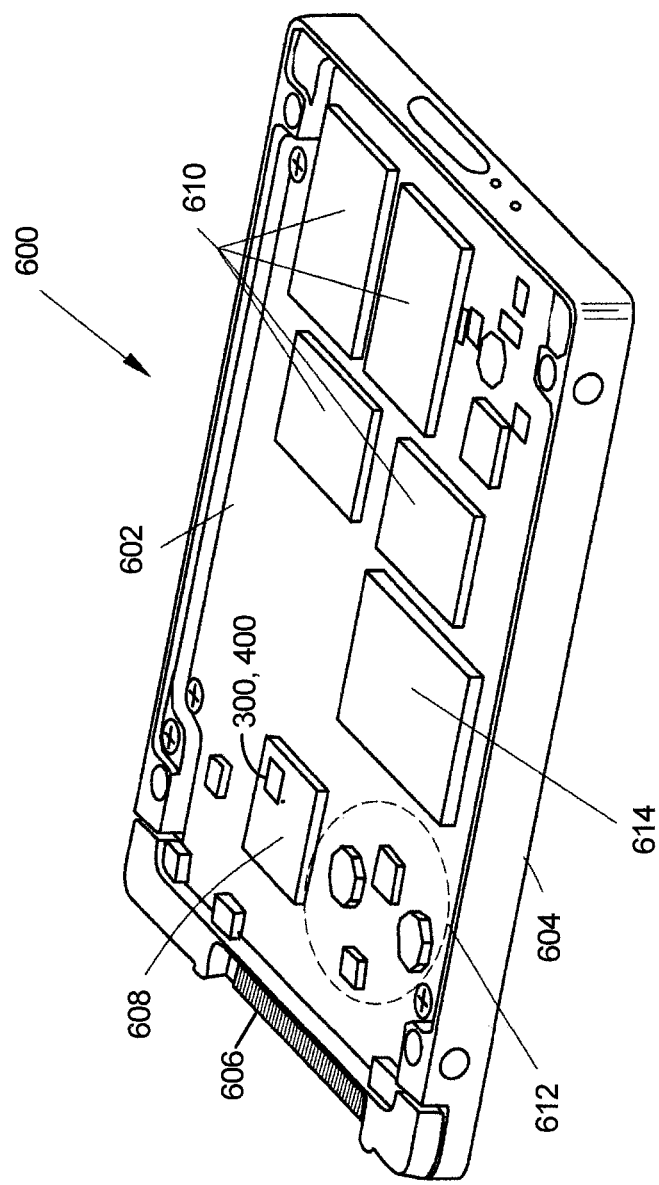
FIG. 6 is an oblique view of a solid state drive (SSD) on which embodiments of the present disclosure may be used.

FIG. 6 illustrates an oblique view of a solid state drive (SSD) 600 in accordance with another embodiment. SSD 600 includes one or more printed circuit boards (PCBs) or circuit card assemblies 602 and typically includes a protective, supportive housing 604, and one or more interface connectors 606. SSD 600 further includes a controller application specific integrated circuit (ASIC) 608, one or more non-volatile memory devices 610, and power regulation circuitry 612. The memory devices 610 are essentially the SSD's data storage media. SSD 600 may include erasure blocks as the physical storage locations within memory device 610, which may include Flash memory devices, for example. In some applications, SSD 600 further includes a power-backup energy storage device, such as a super-capacitor 614.

In accordance with certain aspects, the SSD 600 includes the circuit card assembly 602 that includes a connector 606 for connection to a host computer (not shown). In accordance with certain aspects, the connector 606 includes a NVMe (non-volatile memory express), SCSI (small computer system interface), SAS (serial attached SCSI), FC-AL (fiber channel arbitrated loop), PCI-E (peripheral component interconnect express), IDE (integrated drive electronics), AT (advanced technology), ATA (advanced technology attachment), SATA (serial advanced technology attachment), IEEE (institute of electrical and electronics engineers)-1394, USB (universal serial bus) or other interface connector adapted for connection to a host computer. An I/O cell layout and BBCB (such as those described above with respect to FIGS. 3-4) may also be provided for connecting ASIC 608 to the one or more non-volatile memory devices 610 as also described above.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and therefore are not drawn to scale. Certain proportions within the illustrations may be exaggerated, while other proportions may be reduced. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An input/output (I/O) circuit, comprising:
   at least one power bus having a first size;
   at least one ground bus having the first size;
   an electrostatic discharge (ESD) protection circuit coupled to the at least one power bus or the at least one ground bus, the ESD protection circuit having a second size that is smaller than the first size;
   a connection bus coupled to the ESD protection circuit, the connection bus having the second size and positioned in substantially a same location within the input/output circuit as the ESD protection circuit; and
   a bump or bond pad coupled to the connection bus.

2. The I/O circuit of claim 1, wherein the second size is chosen to accommodate connection to a high current area of the ESD protection circuit.

3. The I/O circuit of claim 1, wherein the connection bus couples the bump or bond pad to lower level lines.

4. The I/O circuit of claim 2, and further comprising:
   a plurality of through vias in the connection bus, the plurality of through vias located in the high current area.

5. The I/O circuit of claim 1, wherein the connection bus is of a third size between the first size and the second size.

6. A solid state drive including the input/output circuit of claim 1.

7. A method of manufacturing an input/output circuit, comprising:
   identifying a connecting area of high current density in an input/output (I/O) cell;
   sizing a connecting bus to a size approximately equal to that of the connecting area of high current density;
   positioning the connecting bus in the connecting area of high current density; and
   connecting high current lines to a high current device at the connecting bus.

8. The method of claim 7, wherein connecting high current lines comprises connecting using through vias.

9. The method of claim 7, and further comprising providing through vias in the connecting bus in the connecting area of high current density.

10. The method of claim 9, and further comprising connecting at least a portion of the high current lines using through vias.

11. The method of claim 7, and further comprising blocking a portion of the I/O cell not used for the connecting bus.

12. The method of claim 7, and further comprising using a portion of the I/O cell not used for the connecting bus as at least one of a power bus or a ground bus.

13. The method of claim 7, and further comprising reducing current density using through vias in the connecting bus.

* * * * *